United States Patent
Kim

(10) Patent No.: US 8,994,455 B2
(45) Date of Patent: Mar. 31, 2015

(54) RADIO FREQUENCY AMPLIFYING APPARATUS HAVING PROTECTION VOLTAGE VARYING FUNCTION

(71) Applicant: Samsung Electro-Mechanics Co., Ltd., Suwon, Gyunggi-do (KR)

(72) Inventor: Youn Suk Kim, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 138 days.

(21) Appl. No.: 13/892,072

(22) Filed: May 10, 2013

(65) Prior Publication Data
US 2014/0232471 A1  Aug. 21, 2014

(30) Foreign Application Priority Data
Feb. 19, 2013  (KR) .......................... 10-2013-0017405

(51) Int. Cl.
*H02H 7/20* (2006.01)
*H03F 1/52* (2006.01)
*H03F 3/19* (2006.01)
*H03F 3/21* (2006.01)

(52) U.S. Cl.
CPC .. *H03F 1/52* (2013.01); *H03F 3/19* (2013.01); *H03F 3/21* (2013.01)
USPC ........................ 330/298; 330/207 P; 330/310

(58) Field of Classification Search
USPC ...................................... 330/298, 207 P, 310
IPC ...................................... H03F 1/52; H02H 7/20
See application file for complete search history.

(56) References Cited

U.S. PATENT DOCUMENTS

| | | | |
|---|---|---|---|
| 6,580,321 B1 * | 6/2003 | Arell et al. ................. | 330/207 P |
| 6,621,351 B2 * | 9/2003 | Hill ............................. | 330/298 |
| 6,636,118 B1 * | 10/2003 | Kusano et al. ................ | 330/298 |
| 6,990,323 B2 * | 1/2006 | Prikhodko et al. ............ | 455/126 |
| 7,330,072 B2 * | 2/2008 | Brandt .......................... | 330/133 |
| 7,482,878 B2 * | 1/2009 | Nakai ........................... | 330/298 |
| 2001/0015881 A1 | 8/2001 | Takikawa et al. | |

FOREIGN PATENT DOCUMENTS

| | | |
|---|---|---|
| JP | 2002-324842 A | 11/2002 |
| KR | 2001-0083225 A | 8/2001 |

* cited by examiner

*Primary Examiner* — Patricia Nguyen
(74) *Attorney, Agent, or Firm* — McDermott Will & Emery LLP

(57) ABSTRACT

There is provided a radio frequency amplifying apparatus having a protection voltage varying function, including a radio frequency amplifying unit amplifying a radio frequency signal, and a protection circuit unit connected between an output node of the radio frequency amplifying unit and a ground and limiting a voltage in the output node to a level of a preset protection voltage or less when the voltage in the output node is higher than the preset protection voltage, wherein the protection voltage is varied with a control signal.

12 Claims, 5 Drawing Sheets

RADIO FREQUENCY AMPLIFYING APPARATUS HAVING PROTECTION VOLTAGE VARYING FUNCTION

CROSS-REFERENCE TO RELATED APPLICATIONS

This application claims the priority of Korean Patent Application No. 10-2013-0017405 filed on Feb. 19, 2013, in the Korean Intellectual Property Office, the disclosure of which is incorporated herein by reference.

BACKGROUND OF THE INVENTION

1. Field of the Invention

The present invention relates to a radio frequency amplifying apparatus capable of being applied to a power amplifying module of a communications system, or the like, and having a protection voltage varying function.

2. Description of the Related Art

Generally, as a wireless communications scheme, a digital modulation and demodulation scheme appropriate in view of improving frequency use efficiency has been used. For example, a quadrature phase shift keying (QPSK) scheme has been used in a code division multiple access (CDMA) type portable phone, and an orthogonal frequency division multiplexing (OFDM) digital modulation scheme has been used in a wireless local area network (WLAN) according to standard 802.11 set by the institute of electrical and electronics engineers (IEEE) (IEEE communications standard 802.11).

A wireless communications system using such wireless communications schemes includes a power amplifying apparatus used in order to amplify a radio frequency signal.

Here, in a system requiring linear amplification, a power amplifying apparatus having linearity in order to amplify a transmission signal without distortion is required. Here, linearity means that even in the case in which a level of power of an input signal is changed, power of an output signal is amplified at a predetermined ratio and a phase thereof is not changed.

Further, in a wireless communications apparatus, a technology of compensating for a temperature so that a power amplifying ratio is not significantly changed, even in the case that ambient temperature is changed, is required.

In addition, a radio frequency amplifying apparatus is used in order to amplify a weak signal in the communications system. Particularly, the radio frequency amplifying apparatus may be used in a transmitter in order to amplify power of a transmission signal.

The radio frequency amplifying apparatus as described above includes at least one amplifying transistor. In the case in which a voltage higher than a withstand voltage able to be withstood by an amplifying transistor is introduced into the amplifying transistor, the amplifying transistor may break down.

In order to prevent the amplifying transistor from breaking down as described above, a protection circuit capable of performing an overvoltage protection function may be added.

The protection circuit as described above serves to block an overvoltage by performing the protection function in a case in which an overvoltage higher than a predetermined voltage is introduced into the amplifying transistor.

The protection circuit used in an existing radio frequency amplifying apparatus may not adjust a reference voltage for determining an overvoltage once the reference voltage is determined at the time of manufacturing the radio frequency amplifying apparatus.

Therefore, once the radio frequency amplifying apparatus is manufactured, a protection voltage is determined in advance, such that it may not be changed. As a result, it is difficult to use the radio frequency amplifying apparatus in other systems, such that there may be a limitation in the system in which the radio frequency amplifying apparatus may be used.

The following Related Art Document relates to a semiconductor integrated circuit and does not disclose a feature in which a protection voltage may be varied.

RELATED ART DOCUMENT

Korean Patent Laid-Open Publication No. 10-2001-0083225

SUMMARY OF THE INVENTION

An aspect of the present invention provides a radio frequency amplifying apparatus capable of appropriately varying a protection voltage according to an environment in which a system in which the radio frequency amplifying apparatus is provided is used after being manufactured.

According to an aspect of the present invention, there is provided a radio frequency amplifying apparatus including: a radio frequency amplifying unit amplifying a radio frequency signal; and a protection circuit unit connected between an output node of the radio frequency amplifying unit and a ground and limiting a voltage in the output node to a level of a preset protection voltage or less when the voltage in the output node is higher than the preset protection voltage, wherein the protection voltage is varied with a control signal.

The protection voltage may be determined according to a voltage generated by a parasitic inductor at the time of grounding the radio frequency amplifying unit and a peak voltage of an input signal.

The protection circuit unit may include first to n-th transistors connected to each other in series between the output node of the radio frequency amplifying unit and the ground, the control signal may include first to n-th control signals for controlling the respective first to n-th transistors, and the respective first to n-th transistors may be turned on or turned off by the respective first to n-th control signals.

The protection voltage may be determined according to the number of transistors in a turned-off state among the first to n-th transistors.

The number of transistors in the turned-off state among the first to n-th transistors may be determined according to the voltage generated by the parasitic inductor at the time of grounding the radio frequency amplifying unit, the peak voltage of the input signal, and threshold voltages of the respective first to n-th transistors.

The radio frequency amplifying unit may include a power amplifier amplifying power of the radio frequency signal.

According to an aspect of the present invention, there is provided a radio frequency amplifying apparatus including: a radio frequency amplifying unit amplifying a radio frequency signal; a protection circuit unit connected between an output node of the radio frequency amplifying unit and a ground and limiting a voltage in the output node to a level of a preset protection voltage or less when the voltage in the output node is higher than the preset protection voltage; and a controlling unit controlling the protection voltage using a control signal.

The protection voltage may be determined according to a voltage generated by a parasitic inductor at the time of grounding the radio frequency amplifying unit and a peak voltage of an input signal.

The protection circuit unit may include first to n-th transistors connected to each other in series between the output node of the radio frequency amplifying unit and the ground, the controlling unit may generate the control signal including first to n-th control signals for controlling the respective first to n-th transistors, and the respective first to n-th transistors may be turned on or turned off by the respective first to n-th control signals.

The protection voltage may be determined according to the number of transistors in a turned-off state among the first to n-th transistors.

The number of transistors in the turned-off state among the first to n-th transistors may be determined according to the voltage generated by the parasitic inductor at the time of grounding the radio frequency amplifying unit, the peak voltage of the input signal, and threshold voltages of the respective first to n-th transistors.

The radio frequency amplifying unit may include a power amplifier amplifying power of the radio frequency signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Figure 1:
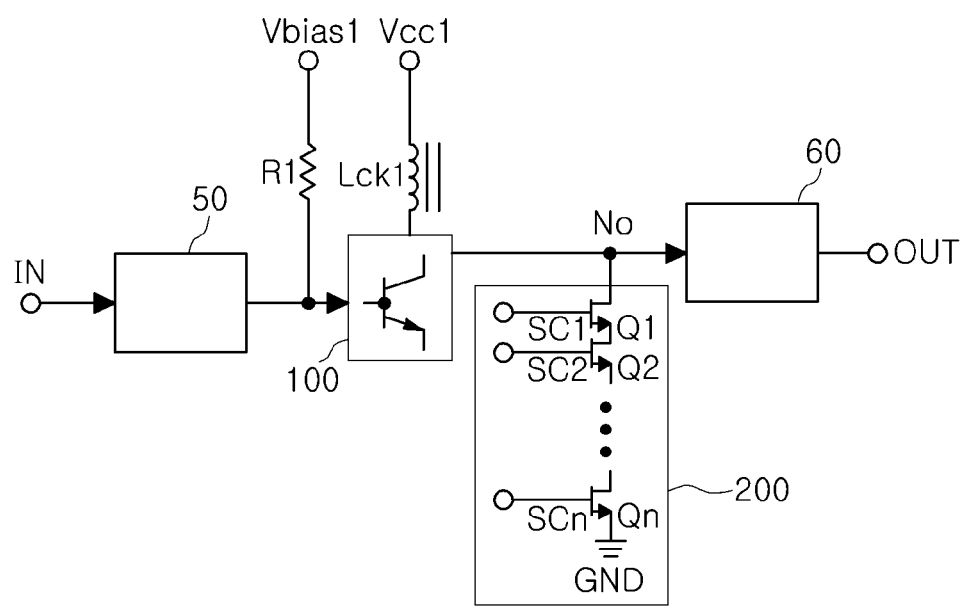
FIG. 1 is a circuit block diagram of a radio frequency amplifying apparatus according to an embodiment of the present invention.

FIG. 1 is a circuit block diagram of a radio frequency amplifying apparatus according to an embodiment of the present invention.

Referring to FIG. 1, the radio frequency amplifying apparatus according to the embodiment of the present invention may include a radio frequency amplifying unit 100 and a protection circuit unit 200.

In addition, the radio frequency amplifying apparatus according to the embodiment of the present invention may further include a controlling unit 300.

The radio frequency amplifying unit 100 may receive a first bias voltage Vbias1 through a resistor R1, receive a first operation voltage Vcc1 through a first choke coil Lck1, and amplify an input radio frequency signal.

The radio frequency amplifying unit 100 may include a power amplifier amplifying power of the radio frequency signal.

Meanwhile, the radio frequency amplifying apparatus according to the embodiment of the present invention may further include a first matching circuit unit 50 and a second matching circuit unit 60.

Here, the first matching circuit unit 50 may transfer the radio frequency signal input through an input terminal IN to the radio frequency amplifying unit 100. In this case, the first matching circuit unit 50 may match an impedance of the input terminal IN and an input impedance of the radio frequency amplifying unit 100 with each other, thereby decreasing loss of the radio frequency signal.

In addition, the second matching circuit unit 60 may transfer a radio frequency signal output from the radio frequency amplifying unit 100 to an output terminal OUT. In this case, the second matching circuit unit 60 may match an output impedance of the radio frequency amplifying unit 100 and an impedance of the output terminal OUT with each other, thereby decreasing loss of the radio frequency signal.

The protection circuit unit 200 may be connected between an output node No of the radio frequency amplifying unit 100 and a ground GND and limit a voltage in the output node No to a preset protection voltage Vp or less when the voltage in the output node No is higher than the preset protection voltage Vp.

Further, in the case in which the radio frequency amplifying apparatus according to the embodiment of the present invention further includes the controlling unit 300, the controlling unit 300 may vary the protection voltage Vp using a control signal SC.

The protection circuit unit 200 and the controlling unit 300 will be described in detail below with reference to FIGS. 2 through 5.

Figure 2:
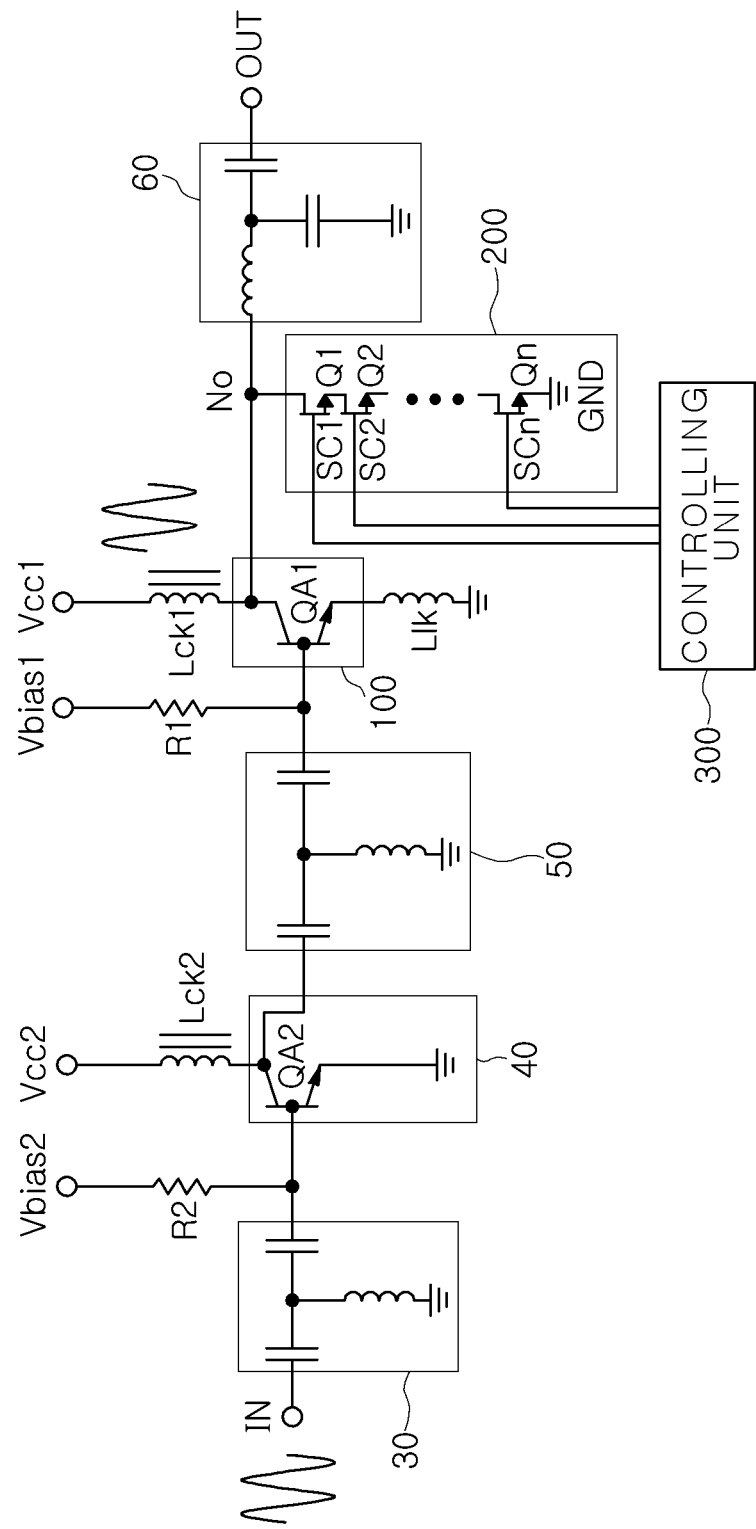
FIG. 2 is a detailed circuit diagram of the radio frequency amplifying apparatus according to the embodiment of the present invention.

FIG. 2 is a detailed circuit diagram of the radio frequency amplifying apparatus according to the embodiment of the present invention.

Referring to FIG. 2, the radio frequency amplifying apparatus according to the embodiment of the present invention may further include an input matching unit 30 and an input amplifying unit 40 disposed between the input terminal IN and the first matching circuit unit 50.

Here, the input matching unit 30 may include at least one of a capacitor and an inductor and match the impedance of the input terminal IN and an input impedance of the input amplifying unit 40 with each other, thereby decreasing loss of the radio frequency signal.

In addition, the input amplifying unit 40 may include an amplifying transistor QA2, receive a second bias voltage Vbais through a resistor R2, receive a second operation voltage Vcc2 through a second choke coil Lch2, and amplify a radio frequency signal from the input matching unit 30.

The first matching circuit unit 50 may include at least one of a capacitor and an inductor.

The radio frequency amplifying unit 100 may include an amplifying transistor QA1 having abase receiving the first bias voltage Vbias1 through the resistor R1 and receiving the radio frequency signal from the first matching circuit unit 50, a collector receiving the first operation voltage Vcc1 through the first choke coil Lck1, and an emitter connected to the ground.

Here, the emitter of the amplifying transistor QA1 may be connected to a ground surface of a printed circuit board (PCB). In this case, the ground surface of the printed circuit board may not be sufficient for grounding, such that a parasitic inductance may be generated in the emitter of the amplifying transistor QA1. The parasitic inductance may be equivalently shown as a parasitic inductor Llk as shown in FIG. 2.

Meanwhile, since loss of the signal may be generated by the parasitic inductor Llk, a level of the radio frequency signal output from the amplifying transistor QA1 may be decreased. In order to supplement the level of the radio frequency signal, the first choke coil Lck1 may be changed to increase the output. However, when the protection voltage Vp in the protection circuit unit 200 is fixed, the output level of the radio frequency signal may be limited by the protection circuit unit 200.

Therefore, even after the radio frequency apparatus according to the embodiment of the present invention is manufactured, there is a need to vary the protection voltage Vp in the protection circuit unit 200.

As an example, the protection voltage Vp may be determined according to a voltage Vlk generated by the parasitic inductor Llk at the time of grounding the radio frequency amplifying unit 100 and a peak voltage Vpeak of an input signal.

In addition, referring to FIG. 2, the protection circuit unit 200 may include first to n-th transistors Q1 to Qn connected to each other in series between the output node No of the radio frequency amplifying unit 100 and the ground GND.

The controlling unit 300 may generate the control signal SC including first to n-th control signals SC1 to SCn for controlling respective first to n-th transistors Q1 to Qn.

Here, respective first to n-th transistors Q1 to Qn may be turned on or turned off by respective first to n-th control signals SC1 to SCn.

Here, the protection voltage Vp may be determined according to the number of transistors in a turned-off state among the first to n-th transistors Q1 to Qn.

The number of transistors in the turned-off state among the first to n-th transistors Q1 to Qn may be determined according to the voltage Vlk generated by the parasitic inductor Llk at the time of grounding the radio frequency amplifying unit 100, the peak voltage Vpeak of the input signal, and threshold voltages Vth of respective first to n-th transistors Q1 to Qn.

As described above, when the number of transistors in the turned-off state among the first to n-th transistors Q1 to Qn is determined, the protection voltage Vp may be determined as represented by the following Equation 1.

Protection voltage ($Vp$)=the number of transistors that are turned off*collector-emitter threshold voltage ($V$th) of transistor An implementation of the protection circuit unit 200 will be described with reference to FIGS. 3 through 5.

Figure 3:
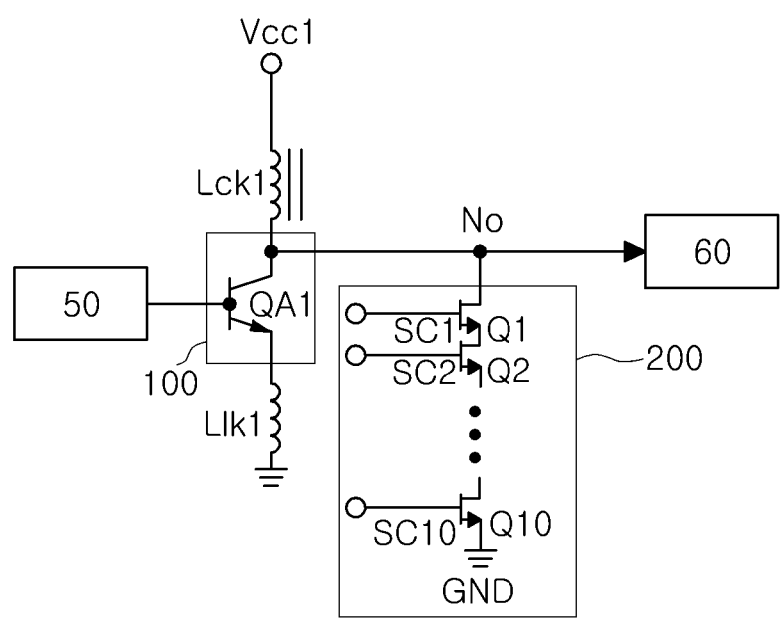
FIG. 3 is a diagram showing an implementation of a protection circuit unit according to the embodiment of the present invention.

FIG. 3 is a diagram showing an implementation of a protection circuit unit 200 according to the embodiment of the present invention. Referring to FIG. 3, in implementation, the protection circuit unit 200 may include first to tenth transistors Q1 to Q10 connected to each other in series between the output node No of the radio frequency amplifying unit 100 and the ground GND.

In addition, the controlling unit 300 may generate the control signal SC including first to tenth control signals SC1 to SC10 for controlling respective first to tenth transistors Q1 to Q10.

The protection voltage Vp determined by the protection circuit unit 200 will be described with reference to FIGS. 4 and 5.

Figure 4:
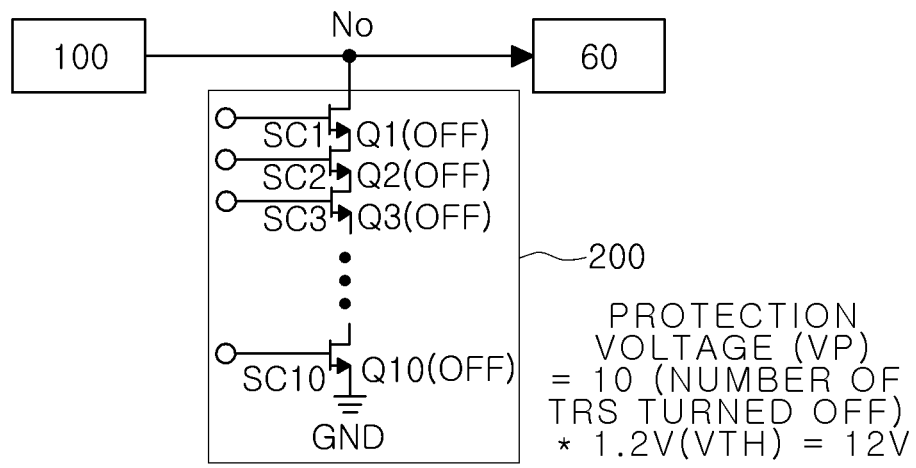
FIG. 4 is a diagram showing an example of a first operation of the protection circuit unit and a controlling unit of FIG. 3.

FIG. 4 is a diagram showing an example of a first operation of the protection circuit unit 200 and the controlling unit 300 of FIG. 3.

Referring to FIG. 4, the controlling unit 300 may provide the first to tenth control signals SC1 to SC10 for controlling all of the first to tenth transistors Q1 to Q10 to be in the turned-off state to the protection circuit unit 200.

In this case, all of the first to tenth transistors Q1 to Q10 of the protection circuit unit 200 may be in the turned-off state.

Here, in the case in which it is assumed that the collector-emitter threshold voltage of respective first to tenth transistors Q1 to Q10 is 1.2V, since the protection voltage is determined according to the number (ten) of transistors that are in the turned-off state, the protection voltage may become 12V (10*1.2V).

Figure 5:
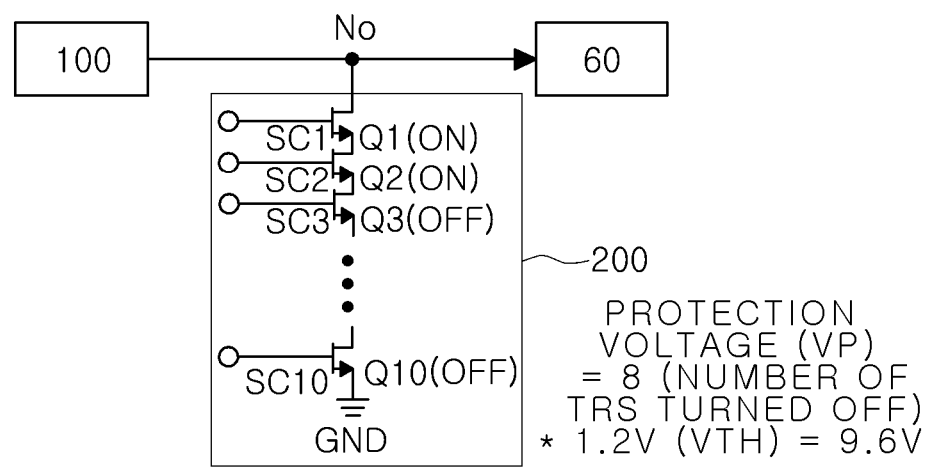
FIG. 5 is a diagram showing an example of a second operation of the protection circuit unit and the controlling unit of FIG. 3.

FIG. 5 is a diagram showing an example of a second operation of the protection circuit unit 200 and the controlling unit 300 of FIG. 3.

Referring to FIG. 5, the controlling unit 300 may provide the first to tenth control signals SC1 to SC10 for controlling the first and second transistors Q1 and Q2 to be in the turned-on state and controlling the third to tenth transistors Q3 to Q10 to be in the turned-off state, among the first to tenth transistors Q1 to Q10, to the protection circuit unit 200.

In this case, the first and second transistors Q1 and Q2 among the first to tenth transistors Q1 to Q10 of the protection circuit unit 200 may be in the turned-on state, and the third to tenth transistors Q3 to Q10 among the first to tenth transistors Q1 to Q10 of the protection circuit unit 200 may be in the turned-off state.

Here, in the case in which it is assumed that the collector-emitter threshold voltage Vth of respective first to tenth transistors Q1 to Q10 is 1.2V, since the protection voltage is determined according to the number (eight) of transistors that are in the turned-off state, the protection voltage may become 9.6V(8*1.2V).

As described above, according to the embodiment of the present invention, the protection voltage Vp of the protection circuit unit 200 may be varied. Therefore, the radio frequency amplifying apparatus according to the embodiment of the present invention may appropriately cope with an environment of a system in which it is used.

As set forth above, according to the embodiment of the present invention, the protection voltage may be appropriately varied according to the environment of the system in which the radio frequency amplifying apparatus is used after being manufactured.

While the present invention has been shown and described in connection with the embodiments, it will be apparent to those skilled in the art that modifications and variations can be made without departing from the spirit and scope of the invention as defined by the appended claims.

What is claimed is:

1. A radio frequency amplifying apparatus comprising:
   a radio frequency amplifying unit amplifying a radio frequency signal; and
   a protection circuit unit connected between an output node of the radio frequency amplifying unit and a ground and limiting a voltage in the output node to a level of a preset protection voltage or less when the voltage in the output node is higher than the preset protection voltage,
   wherein the protection voltage is varied with a control signal.

2. The radio frequency amplifying apparatus of claim 1, wherein the protection voltage is determined according to a voltage generated by a parasitic inductor at the time of grounding the radio frequency amplifying unit and a peak voltage of an input signal.

3. The radio frequency amplifying apparatus of claim 1, wherein the protection circuit unit includes first to n-th transistors connected to each other in series between the output node of the radio frequency amplifying unit and the ground, the control signal includes first to n-th control signals for controlling the respective first to n-th transistors, and the respective first to n-th transistors are turned on or turned off by the respective first to n-th control signals.

4. The radio frequency amplifying apparatus of claim 3, wherein the protection voltage is determined according to the number of transistors in a turned-off state among the first to n-th transistors.

5. The radio frequency amplifying apparatus of claim 4, wherein the number of transistors in the turned-off state among the first to n-th transistors is determined according to the voltage generated by the parasitic inductor at the time of grounding the radio frequency amplifying unit, the peak voltage of the input signal, and threshold voltages of the respective first to n-th transistors.

6. The radio frequency amplifying apparatus of claim 1, wherein the radio frequency amplifying unit includes a power amplifier amplifying power of the radio frequency signal.

7. A radio frequency amplifying apparatus comprising:

a radio frequency amplifying unit amplifying a radio frequency signal;

a protection circuit unit connected between an output node of the radio frequency amplifying unit and a ground and limiting a voltage in the output node to a level of a preset protection voltage or less when the voltage in the output node is higher than the preset protection voltage; and a controlling unit controlling the protection voltage using a control signal.

8. The radio frequency amplifying apparatus of claim 7, wherein the protection voltage is determined according to a voltage generated by a parasitic inductor at the time of grounding the radio frequency amplifying unit and a peak voltage of an input signal.

9. The radio frequency amplifying apparatus of claim 7, wherein the protection circuit unit includes first to n-th transistors connected to each other in series between the output node of the radio frequency amplifying unit and the ground, the controlling unit generates the control signal including first to n-th control signals for controlling the respective first to n-th transistors, and the respective first to n-th transistors are turned on or turned off by the respective first to n-th control signals.

10. The radio frequency amplifying apparatus of claim 9, wherein the protection voltage is determined according to the number of transistors in a turned-off state among the first to n-th transistors.

11. The radio frequency amplifying apparatus of claim 10, wherein the number of transistors in the turned-off state among the first to n-th transistors are determined according to the voltage generated by the parasitic inductor at the time of grounding the radio frequency amplifying unit, the peak voltage of the input signal, and threshold voltages of the respective first to n-th transistors.

12. The radio frequency amplifying apparatus of claim 7, wherein the radio frequency amplifying unit includes a power amplifier amplifying power of the radio frequency signal.

\* \* \* \* \*